(12) United States Patent
Kim et al.

(10) Patent No.: US 11,424,753 B2
(45) Date of Patent: Aug. 23, 2022

(54) SUCCESSIVE-APPROXIMATION-REGISTER (SAR) ANALOG-TO-DIGITAL CONVERTER (ADC) TIMING CALIBRATION

(71) Applicant: AyDeeKay LLC, Aliso Viejo, CA (US)

(72) Inventors: Robert W. Kim, Aliso Viejo, CA (US); Christopher A. Menkus, Aliso Viejo, CA (US)

(73) Assignee: Ay Dee Kay LLC, Aliso Viejo, CA (US)

( * ) Notice: Subject to any disclaimer, the term of this patent is extended or adjusted under 35 U.S.C. 154(b) by 0 days.

(21) Appl. No.: 17/322,869

(22) Filed: May 17, 2021

(65) Prior Publication Data

US 2022/0149858 A1 May 12, 2022

Related U.S. Application Data

(60) Provisional application No. 63/110,892, filed on Nov. 6, 2020.

(51) Int. Cl.
*H03M 1/10* (2006.01)

(52) U.S. Cl.
CPC .................................. *H03M 1/1038* (2013.01)

(58) Field of Classification Search
CPC .............................. H03M 1/1038; H03M 1/12
USPC .................................................. 341/120, 155
See application file for complete search history.

(56) References Cited

U.S. PATENT DOCUMENTS

| | | |
|---|---|---|
| 8,344,925 B1 | 1/2013 | Evans |
| 8,786,483 B1 | 7/2014 | Thompson |
| 9,124,291 B2 * | 9/2015 | Chen ...................... H03M 1/466 |
| 9,258,008 B2 * | 2/2016 | Singh ..................... H03M 1/462 |
| 9,537,503 B2 * | 1/2017 | Chen ................... H03M 1/0682 |
| 9,608,652 B2 | 3/2017 | Lee et al. |
| 9,847,790 B2 * | 12/2017 | Liu ........................ H03M 1/145 |
| 9,871,529 B1 | 1/2018 | Chong |
| 10,116,318 B1 | 10/2018 | Sharif |
| 10,454,492 B1 | 10/2019 | Shikata et al. |
| 10,505,559 B1 | 12/2019 | Chao |
| 2014/0022105 A1 * | 1/2014 | Chen ....................... H03M 1/06 341/161 |

(Continued)

OTHER PUBLICATIONS

International Search Report and Written Opinion, PCT application serial No. PCT/US21/58001, dated Jan. 31, 2022.

*Primary Examiner* — Jean B Jeanglaude
(74) *Attorney, Agent, or Firm* — Steven Stupp

(57) ABSTRACT

An analog-to-digital converter (ADC) is described. This ADC includes a conversion circuit with multiple bit-conversion circuits. During operation, the ADC may receive an input signal. Then, the conversion circuit may asynchronously perform successive-approximation-register (SAR) analog-to-digital conversion of the input signal using the bit-conversion circuits, where the bit-conversion circuits to provide a quantized representation of the input signal. For example, the bit-conversion circuits may asynchronously and sequentially perform the SAR analog-to-digital conversion to determine different bits in the quantized representation of the input signal. Moreover, the ADC may selectively perform self-calibration of a global delay of the bit-conversions circuits. Note that the timing self-calibration may be iterative and subject to a constraint that a maximum conversion time is less than a target conversion time.

20 Claims, 7 Drawing Sheets

(56) References Cited

U.S. PATENT DOCUMENTS

| | | | |
|---|---|---|---|
| 2015/0280728 A1* | 10/2015 | Singh | H03M 1/125 341/122 |
| 2016/0006450 A1* | 1/2016 | Chen | H03M 1/38 341/161 |
| 2016/0322985 A1* | 11/2016 | Chen | H03M 1/06 |
| 2017/0244424 A1* | 8/2017 | Liu | H03M 1/54 |
| 2017/0346500 A1* | 11/2017 | Chen | H03M 1/125 |
| 2020/0036387 A1 | 1/2020 | Tang | |

* cited by examiner

SUCCESSIVE-APPROXIMATION-REGISTER (SAR) ANALOG-TO-DIGITAL CONVERTER (ADC) TIMING CALIBRATION

CROSS REFERENCE TO RELATED APPLICATIONS

This application claims priority under 35 U.S.C. 119(e) to U.S. Provisional Application Ser. No. 63/110,892, entitled "Successive-Approximation-Register (SAR) Analog-to-Digital Converter (ADC) Timing Calibration," by Christopher A. Menkus, et al., filed on Nov. 6, 2020, the contents of both of which are herein incorporated by reference.

FIELD

The present disclosure relates to an analog-to-digital converter (ADC). Notably, the present disclosure relates to an ADC that performs asynchronous successive-approximation-register (SAR) analog-to-digital conversion with iterative self-calibration of an associated time delay or conversion time.

BACKGROUND

Many existing systems convert analog signals to the digital domain using ADCs. One type of ADC performs SAR analog-to-digital conversion. For example, FIG. 1 presents a block diagram illustrating an existing ADC 100 that performs N-bit SAR analog-to-digital conversion. Notably, in this existing ADC, a track/hold circuit 110 may sample and hold an analog input signal as VIN. Then, a comparator 112 compares VIN to a quantized output VDAC provided by an N-bit digital-to-analog converter (DAC) 114 that performs digital-to-analog conversion based on initial settings of an N-bit register 116. Moreover, based on the comparison, SAR control logic 118 may update the settings of N-bit register 116, so that VDAC better represents VIN. When a convergence criterion is achieved (such as when a mean square error between VIN and VDAC is minimized), the settings of N-bit register 116 may be output as a quantized representation of VIN.

Moreover, in a binary search technique, N-bit register 116 may be set to midscale (e.g., initial settings of N-bit register 116 may be 100 . . . 00, where the most-significant bit (MSB) is set to '1'). This may result in VDAC being equal to one half of a reference voltage VREF, which is provided to existing ADC 100. Comparator 112 may then determine if VIN is less than or greater than VDAC. If VIN is greater than VDAC, an output of comparator 112 may be a logical high (e.g., '1') and the MSB of N-bit register 116 may remain at 1. Alternatively, if VIN is less than VDAC, the output of comparator 112 may be a logical low (e.g., a '0') and the MSB of N-bit register 116 may be cleared to a logical 0. Next, SAR control logic 118 may proceed to a subsequent bit by, e.g., forcing that bit high, and performing another comparison. This sequence may continue until the least-significant bit (LSB). Once the is LSB is processed, the analog-to-digital conversion is complete and the N-bit quantized (digital) representation or word is available in N-bit register 116.

More generally, many SAR ADCs use a capacitive DAC that provides an inherent track/hold function. Capacitive DACs use charge redistribution to generate an analog output voltage. Typically, even small variations in the LSB capacitors may result in errors in the high-resolution quantized representation. Consequently, the capacitors in an array are often production-trimmed in order to reduce the errors. However, trimming alone usually does not yield the desired performance or compensate for changes in the performance associated with changes in temperature, supply voltage, and other parameters.

For example, process, voltage, and temperature (PVT) variation usually cause large variations in the response time of a feedback loop that includes a comparator and a capacitor DAC feedback loop in an asynchronous SAR ADCs. If a time delay or conversion time in the feedback loop is too short, the comparator may not have sufficient settling time, which may decrease the accuracy of the SAR ADC. Alternatively, if the time delay or conversion time in the feedback loop is too long, some bits may be truncated, because a conversion period of the SAR ADC may expire before values of all of the bits have been successfully resolved.

Therefore, high-resolution SAR ADCs are typically recalibrated when there is a significant change in supply voltages, temperature, reference voltage, and/or clock characteristics. However, this recalibration often increases the overall system cost and complexity.

SUMMARY

Embodiments of an ADC are described. This ADC includes a conversion circuit that asynchronously performs SAR analog-to-digital conversion of an input signal using bit-conversion circuits, where the bit-conversion circuits provide a quantized representation of the input signal. Moreover, the ADC may selectively perform self-calibration of a global delay of the bit-conversions circuits.

Note that the timing self-calibration may be iterative and subject to a constraint that a maximum conversion time is less than a target conversion time. For example, the target conversion time may correspond to a conversion period specified by a sampling clock. In some embodiments, the target conversion time may have headroom relative to the conversion period.

Moreover, the ADC may include a track and hold circuit that samples the input signal based at least in part on the sampling clock.

Furthermore, the bit-conversion circuits may asynchronously and sequentially perform the SAR analog-to-digital conversion to determine different bits in the quantized representation of the input signal. The bit-conversion circuits may perform the SAR analog-to-digital conversion based at least in part on a target reference that specifies the global delay of the bit-conversion circuits and the target conversion time. Additionally, the ADC may include a feedback circuit that compares the quantized representation and the input signal and that provides a feedback signal.

In some embodiments, the ADC may include control logic that adjusts the global delay of the target reference based at least in part on the feedback signal until a conversion time, when the bit-conversion circuits complete determination of the quantized representation, approximately equals the target conversion time. Note that approximately equals may mean that the conversion time is less than or equal to the target conversion time and a difference between the target conversion time and the conversion time is minimized.

Moreover, the control logic may adjust the global delay based at least in part on historical or prior target references that were determined during prior SAR analog-to-digital conversions. For example, the control logic may determine the target reference based at least in part on an average of the historical or prior target references. Alternatively or additionally, the control logic may determine the target reference using systematic underrelaxation of the historical or prior target references.

Furthermore, the control logic may adjust the global delay based at least in part on a search technique. For example, the search technique may include: a linear search, or a binary search.

Additionally, the control logic may adjust the global delay based at least in part on a function corresponding to the historical or the prior target references or a look-up table that comprises the historical or prior target references.

In some embodiments, the control logic may selectively adjust the global delay based at least in part on a change in an environmental characteristic. For example, the environmental characteristic may include noise, temperature or a power-supply voltage of the ADC.

Another embodiment provides a system (such as an electronic device) that includes the ADC.

Another embodiment provides an integrated circuit that includes the ADC.

Another embodiment provides a method for performing analog-to-digital conversion. This method includes at least some of the operations performed by the ADC.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

Figure 1:
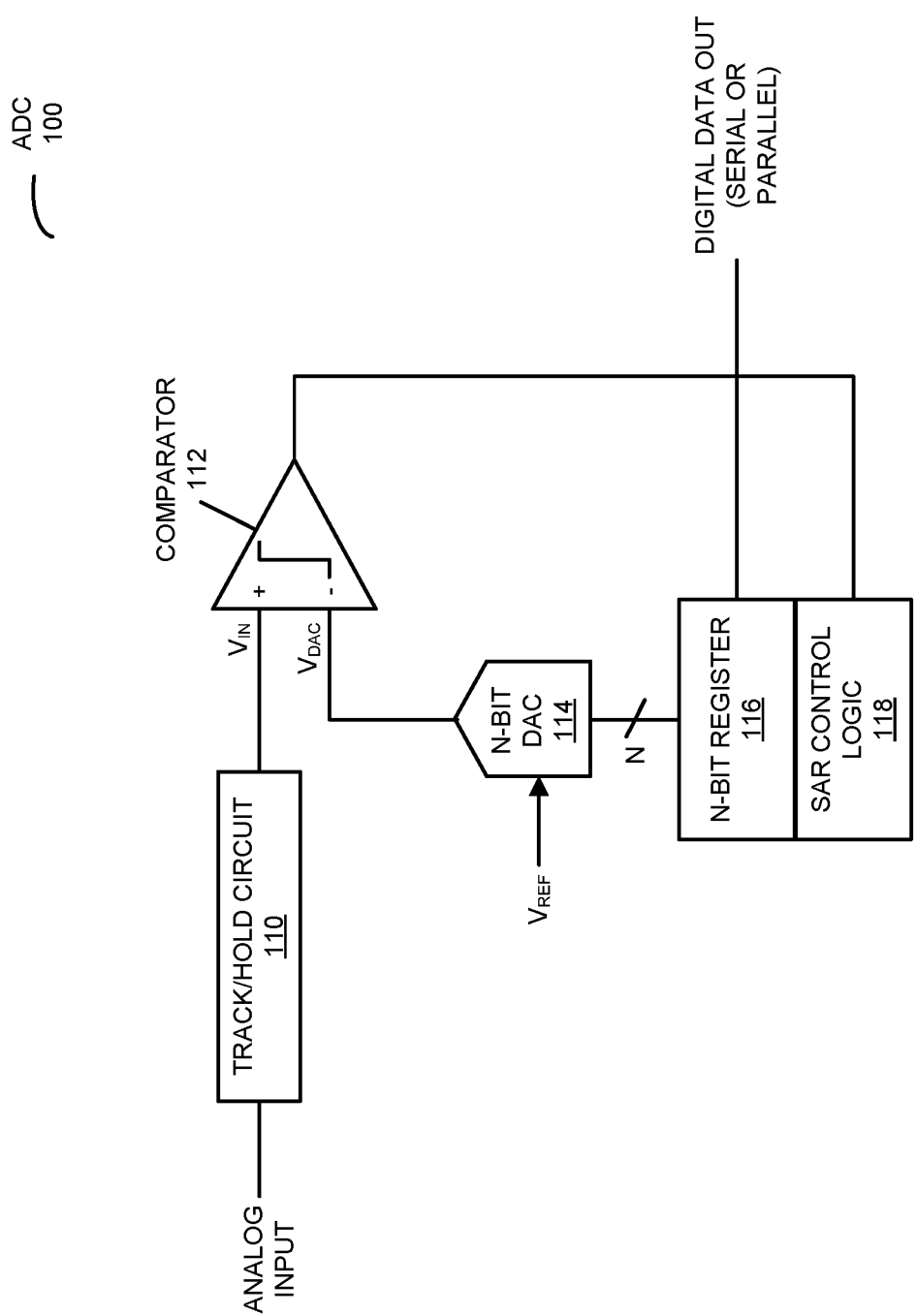
FIG. 1 is a block diagram illustrating an existing analog-to-digital converter (ADC).

An analog-to-digital converter (ADC) is described. This ADC includes a conversion circuit with multiple bit-conversion circuits. During operation, the ADC may receive an input signal. Then, the conversion circuit may asynchronously perform successive-approximation-register (SAR) analog-to-digital conversion of the input signal using the bit-conversion circuits, where the bit-conversion circuits to provide a quantized representation of the input signal. For example, the bit-conversion circuits may asynchronously and sequentially perform the SAR analog-to-digital conversion to determine different bits in the quantized representation of the input signal. Moreover, the ADC may selectively perform self-calibration of a global delay of the bit-conversions circuits. Note that the timing self-calibration may be iterative and subject to a constraint that a maximum conversion time is less than a target conversion time.

In some embodiments, the ADC may include a track and hold circuit that tracks and holds the input signal based at least in part on a sampling clock, and the conversion circuit that asynchronously performs the SAR analog-to-digital conversion of the input signal using the bit-conversion circuits. Notably, the bit-conversion circuits may provide the quantized outputs corresponding to the input signal based at least in part on a target reference, where the target reference has the target conversion time that corresponds to and is less than a conversion period specified by the sampling clock and that has the global delay time of the bit-conversion circuits. Then, a feedback circuit may compare the input signal to the quantized outputs and may selectively adapt the quantized outputs until convergence criteria of the bit-conversion circuits are achieved. Moreover, control logic in the ADC may iteratively modify the target reference to adjust the global delay time and may repeat one or more instances of the SAR analog-to-digital conversion until a time delay or conversion time, when the convergence criteria are achieved in an instance of the SAR analog-to-digital conversion, approximately equals the target conversion time.

By performing the timing self-calibration, these circuit techniques may reduce the impact of process, voltage, and temperature (PVT) variation on the embodiments of the ADC. Notably, the circuit techniques may ensure that the conversion time is not too short, so that the embodiments of the ADC have sufficient settling time, which may increase the accuracy of the ADC. Furthermore, the circuit techniques may ensure that the conversion time is not too short, so that some bits in the quantized representation may not be truncated because the conversion period of the ADC expired before values of all of the bits were successfully resolved. Therefore, the embodiments of the ADC may not need to be recalibrated unless there is a significant change in supply voltages, temperature, reference voltage, and/or clock characteristics. Consequently, the circuit techniques may reduce the cost and complexity of the embodiments of the ADC. One or more of these capabilities may allow the embodiments of the ADC to be used in a wide variety of systems, electronic devices and applications.

We now describe embodiments of the ADC. In some embodiments, an asynchronous SAR ADC may include a timing self-calibration feedback loop. In a given instance of analog-to-digital conversion performed by the SAR ADC, a 'done' signal may be provided when the given instance of the analog-to-digital conversion is completed (e.g., when convergence criteria of bit-conversion circuits are achieved, which is sometimes referred to as a 'time delay' or a 'conversion time' of the SAR ADC). Moreover, in the self-calibration feedback loop, the SAR ADC may start with a minimum global delay of bit-conversion circuits (e.g., a digital counter may be set to zero). Then, in one or more subsequent instances of the analog-to-digital conversion, the global delay in the self-calibration feedback loop may be increased (and, more generally, changed) until the conversion time approximately equals a target conversion time in an instance of the analog-to-digital conversion (e.g., when the done signal is provided at a conversion time that is less than or equal to the target conversion time, and that has the smallest time difference from the target conversion time).

In some embodiments, a target reference for the SAR ADC, which includes the global delay of the bit-conversion circuits and the target conversion time, may be programmable. This target reference may be provided by control logic based at least in part on a higher-speed clock (which is sometimes referred to as a 'sampling clock' or a 'SAR clock') or a delay-locked loop, which may generate multiple spaced phases or pulses within the period of the sampling clock (which is sometimes referred to as a 'conversion period'). For example, for a 10-bit SAR ADC, the delay-locked loop may generate 10 or 16 phases or pulses within the conversion period. Note that the higher-speed clock or the delay-locked loop may be included in the SAR ADC or may be external to the SAR ADC.

Moreover, in some embodiments, a master/slave approach is used to replicate the timing self-calibrated information (e.g., the target reference(s)) across multiple SAR ADCs in an interleaved array. These embodiments may allow a higher-speed clock to be divided down to produce two slower-speed clocks for the first master SAR ADC and the first set of slave SAR ADCs, and for the second master SAR ADC and the second set of slave SAR ADCs. For example, a first master SAR ADC may determine and provide a first target reference to a first set of slave SAR ADCs that process even bits and a second master SAR ADC may determine and provide a second target reference to a second set of slave SAR ADCs that process odd bits. Notably, a digital code in the self-calibration feedback loop of a given master SAR ADC may be loaded into a given matched slave SAR ADC. Furthermore, because a given target reference is shared, the number of unique target references that need to be generated for the interleaved SAR ADCs may be reduced. Additionally, there may be less variation between the slave SAR ADCs because of variations in timing self-calibration.

Figure 2:
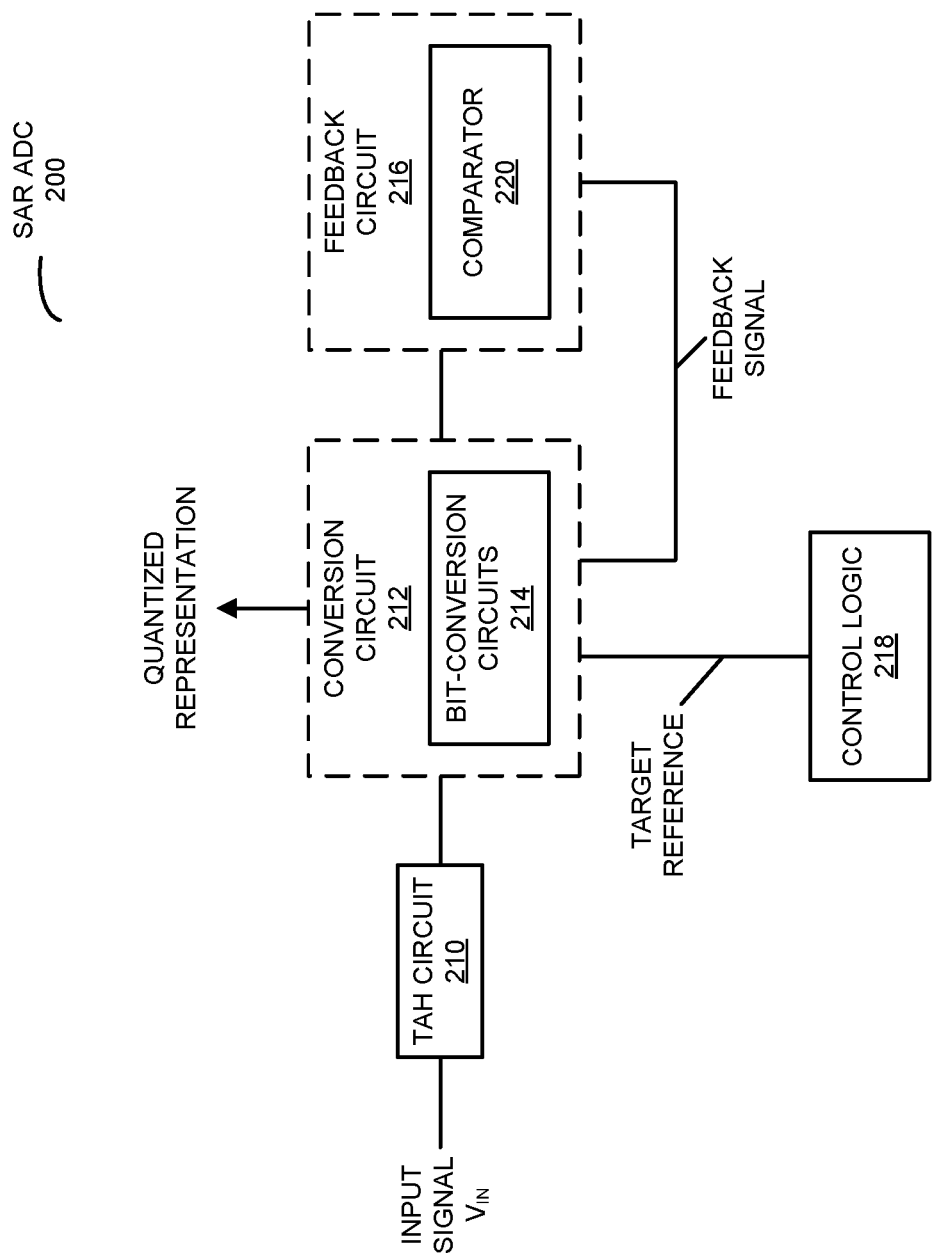
FIG. 2 is a block diagram illustrating an example of a successive-approximation-register (SAR) ADC according to some embodiments of the present disclosure.

FIG. 2 presents a block diagram illustrating an example of a SAR ADC 200 according to some embodiments of the present disclosure. This asynchronous SAR ADC may include: a track and hold (TAH) circuit 210, a conversion circuit 212 with bit-conversion circuits 214, a feedback circuit 216 and control logic 218. During operation, TAH circuit 210 may track and hold an input signal based at least in part on a sampling clock (SAR CLK). Moreover, bit-conversion circuits 214 may asynchronously perform SAR analog-to-digital conversion of the input signal.

Notably, bit-conversion circuits 214 may provide quantized outputs corresponding to the input signal based at least in part on a target reference provided by control logic 218 in SAR ADC 200. Note that the target reference may have a target conversion time that corresponds to and is less than a conversion period specified by the sampling clock (e.g., the target conversion period may be a fraction of the conversion period, so that there is headroom in the SAR analog-to-digital conversion) and that has a global delay time of bit-conversion circuits 214 (which is less than the conversion period). For example, the sampling clock may be 100 MHz, the associated convergence period may be 10 ns, and the target conversion time may be 10-20% smaller than the convergence period (e.g., 8-9 ns or headroom of 1-2 ns).

Moreover, feedback circuit 216 may compare (e.g., using a comparator 220) the input signal to the quantized outputs and may selectively adapt the quantized outputs until convergence criteria of bit-conversion circuits 214 are achieved. For example, a given bit-conversion circuit may adapt its quantized output until a given convergence criterion is achieved, such as a mean-square error of MSE between the input signal and the quantized output is minimized. (Consequently, the delay of the given bit-conversion circuit may be larger than the global delay and may be different from the delays of one or more of the remaining bit-conversion circuits.) Then, the subsequent bit-conversion circuit may adapt its quantized output. In this way, bit-conversion circuits 214 may sequentially (from the MSB to the LSB) and selectively adapt their quantized outputs.

Furthermore, control logic 218 may iteratively modify the target reference to adjust the global delay time and repeat one or more instances of the SAR analog-to-digital conversion until a time delay or conversion time when the convergence criteria are achieved in an instance of the SAR analog-to-digital conversion approximately equals the target conversion time. For example, the conversion time may be less than or equal to the target conversion time, and may have the smallest or minimum time difference from the target conversion time.

In some embodiments, SAR ADC 200 may use a linear-search technique to determine the global delay and, thus, the target reference. For example, the global delay may initially have a minimum value in a first instance of the SAR analog-to-digital conversion and may be incrementally and monotonically increased in subsequent instances of the SAR analog-to-digital conversion until the conversion period approximately equals the target conversion period. This approach may determine the smallest global delay, so that SAR ADC 200 can address problems associated with process, voltage and/or temperature variation. However, in other embodiments a wide variety of search techniques may be used, such as a binary-search technique (in which case the variation of the global delay in instances of the SAR analog-to-digital conversion may not be monotonic) or a statistical search technique (which is based on historical values of the global delay in the target reference).

In these ways, SAR ADC 200 may perform a timing self-calibration to adjust the target reference, so that bit-conversion circuits 214 have sufficient time to achieve the conversion criteria. However, in contrast with a synchronous (fixed rate) SAR ADC, bit-conversion circuits 214 in disclosed SAR ADC 200 may take different amounts of time to achieve their convergence criteria. Additionally, the target reference may be selected so that the conversion time approximately equals the target conversion time. This may ensure that bit-conversion circuits 214 have the time they need to perform the SAR analog-to-digital conversion, while also ensuring that the conversion time is less than or equal to the target conversion period and, thus, is within the conversion period.

(Note that, in some embodiments, one or more of bit-conversion circuits 214 may not achieve their convergence criteria. For example, because each bit-conversion circuit may adjust itself, if a given bit-conversion circuit hits a metastable point, the time needed to achieve the given convergence criterion, such as so that it may be longer. This may, on in-frequent occasions, adversely impact the LSB bit-conversion circuit(s) in the sequence (such as 1-2 bits out of 12 bits), so that they do not have sufficient time to achieve the convergence criteria before the target conversion time. However, because the MSBs are performed first in the sequence, the resulting error is bounded and is not significant.)

In some embodiments of SAR ADC 200, TAH circuit 210, a DAC in feedback circuit 216 and/or control logic 218 may be combined into a single component. For example, TAH circuit 210 may be implemented using a capacitive array, and switches in the capacitive array may perform the digital-to-analog conversion.

Figure 3:
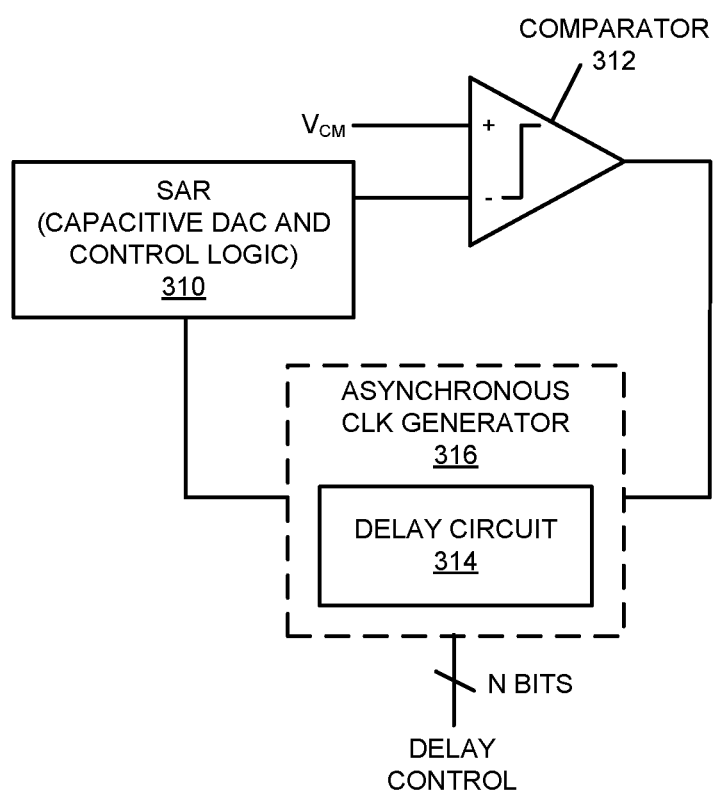
FIG. 3 is a block diagram illustrating an example of a bit-conversion circuits and a feedback circuit in a SAR ADC according to some embodiments of the present disclosure.

This is illustrated in FIG. 3, which presents a block diagram illustrating an example of a bit-conversion circuits and a feedback circuit in a SAR ADC according to some embodiments of the present disclosure. Notably, the bit-conversion circuits in the SAR ADC may include a SAR 310, which includes a capacitive DAC and control logic. Moreover, the feedback circuit may include a comparator 312 and a delay circuit 314 (such as in an asynchronous clock generator 316). This delay circuit may include a delay line that adjustably delays a feedback signal from comparator 312 based at least in part on an n-bit control signal, such as the target reference. Note that FIG. 3 presents a single-ended diagram for clarity. However, in other embodiments, the circuits may be differential.

Figure 4:
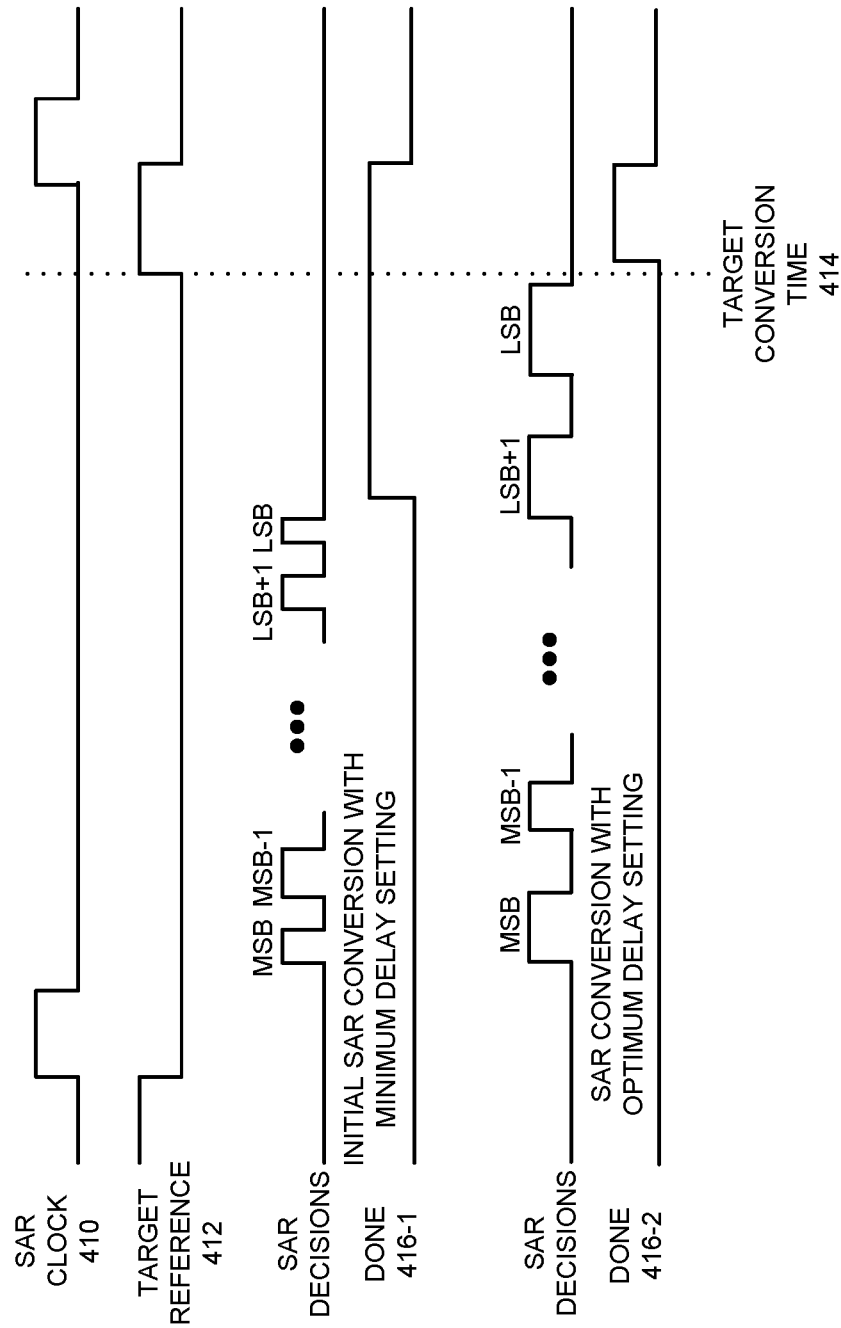
FIG. 4 is a timing diagram illustrating an example of waveforms during operation of a SAR ADC that performs a timing self-calibration according to some embodiments of the present disclosure.

FIG. 4 presents a timing diagram illustrating an example of waveforms during operation of a SAR ADC that performs a timing self-calibration according to some embodiments of the present disclosure. During operation, SAR clock 410 may define or specify the master conversion rate of the SAR ADC. Notably, the SAR ADC may track the input signal when SAR clock 410 is logical high and may perform SAR analog-to-digital conversion when SAR clock 410 is logical low. In some embodiments, note that that SAR clock 410 may not have a 50% duty cycle.

Moreover, a target reference 412 may be defined based at least in part on SAR clock 410 (e.g., based at least in part on a period or conversion period of SAR clock 410, such as the time when SAR clock 410 is logical low. Notably, target reference 412 may have a predefined or predetermined target conversion time 414. Target reference 412 may also have an initial global delay for the bit-conversion circuits. For example, the initial global delay may be a minimum value of the global delay. During the subsequent initial SAR analog-to-digital conversion, the bit-conversion circuits may sequentially determine values of bits (MSB to LSB) in a quantized or digital representation of the input signal. The initial SAR analog-to-digital conversion by the bit-conversion circuits may be completed when the done signals 416 go from logical low to logical high.

Because the initial SAR analog-to-digital conversion is completed before the target conversion time, the SAR ADC may modify target reference 412 using the timing self-calibration process and may iterate the SAR analog-to-digital conversion one or more additional times. Notably, the global delay of the bit-conversion circuits may be changed (e.g., in a linear-search technique, the global delay may be incrementally increased in each instance of the SAR analog-to-digital conversion) and the SAR analog-to-digital conversion may be repeated. This process may continue until the conversion time is approximately equal to target conversion time 414 (e.g., the conversion time is less than or equal to target conversion time 414 and a difference between target conversion time 414 and the conversion time in the different instances of the SAR analog-to-digital conversion is reduced or minimized). Note that this approach may allow the smallest optimal global delay to be selected, which may provide sufficient time (subject to the target conversion time constraint) for the quantized representation of the input signal to be determined by the bit-conversion circuits. This capability may allow the SAR ADC to address the impact of process, voltage and/or temperature variation on the SAR analog-to-digital conversion of the input signal.

Figure 5:
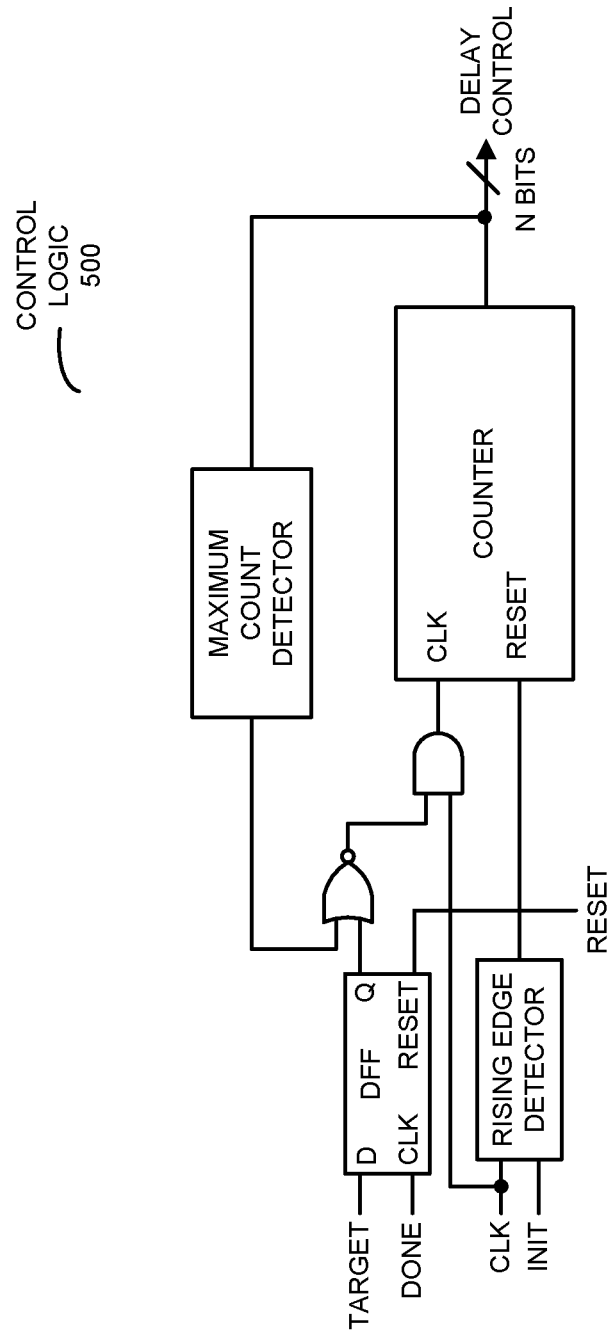
FIG. 5 is a block diagram illustrating an example of control logic in a SAR ADC according to some embodiments of the present disclosure.

FIG. 5 presents a block diagram illustrating an example of control logic 500 in a SAR ADC according to some embodiments of the present disclosure. This control circuit may start with a minimum value of the initial global delay in the target reference, and then may increment the global delay of the target reference (via the n-bit delay control in FIG. 3) in each subsequent instance of the SAR analog-to-digital conversion until a maximum delay occurs or until the done signal occurs after the target conversion time (as detected by a D flip-flop or DFF).

As noted previously, in some embodiments the SAR ADC may be interleaved. Notably, there may be two sets of SAR ADCs, which may perform SAR analog-to-digital conversion of the same or different input signals. For example, one set of SAR ADCs may determine even bits in a quantized representation of an input signal, and another set of SAR ADCs may determine odd bits in the quantized representation of the input signal. This approach may allow the SAR ADCs to operate using a reduced SAR clock (which may be derived from a higher-speed clock) and may allow the bit-conversion circuits to have more time to determine the quantized representation of the input signal. For example, the even or odd master/slave SAR ADCs may ping pong the determined quantized representation of the input signal in order to obtain improved accuracy or sufficient conversion time. Alternatively, the even or odd master/slave SAR ADCs may determine the quantized representation of the input signal in parallel or concurrently.

In addition, in some embodiments there may be master and slave SAR ADCs. This approach may eliminate the need for all of the SAR ADCs to determine the target reference. Instead, the master SAR ADC may determine the target reference, which is then provided to the slave SAR ADCs.

Figure 6:
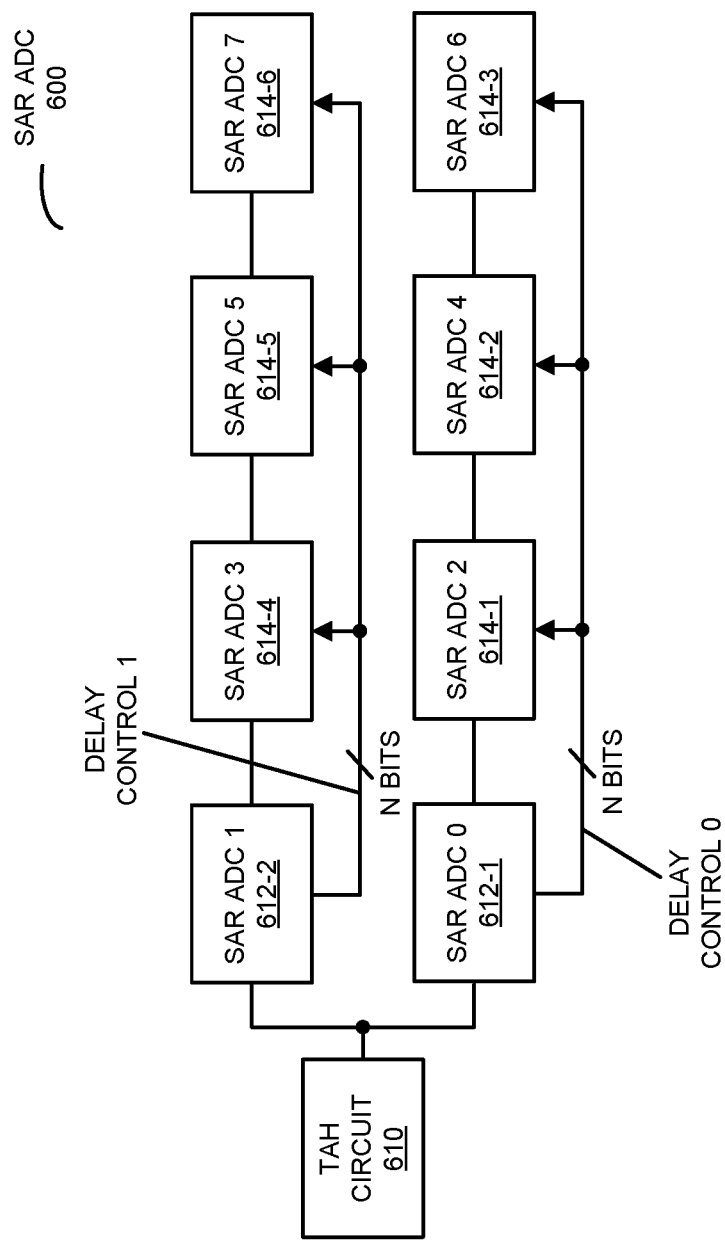
FIG. 6 is a block diagram illustrating an example of interleaved master and slave ADCs according to some embodiments of the present disclosure.

The combination of both of the aforementioned embodiments is shown in FIG. 6, which presents a block diagram illustrating an example of interleaved master and slave ADCs according to some embodiments of the present disclosure. Notably, TAH circuit 610 may track and hold the input signal, which is provided to master SAR ADC 0 612-1 and master SAR ADC 1 612-2 during the SAR analog-to-digital conversion. Master SAR ADC 0 612-1 and master SAR ADC 1 612-2 may each determine target references, which are provided (via the n-bit delay control) to slave SAR ADCs 614. For example, master SAR ADC 0 612-1 may provide a first target reference to slave SAR ADC 2 614-1, SAR ADC 4 614-2 and SAR ADC 6 614-3, and master SAR ADC 1 612-2 may provide a first target reference to slave SAR ADC 3 614-4, SAR ADC 5 614-5 and SAR ADC 7 614-6.

In some embodiments, the target reference for a SAR ADC may be selected based at least in part on historical or prior target references that were obtained in prior SAR analog-to-digital conversions. This may allow the target reference during a SAR analog-to-digital conversion to be determined more rapidly, such as when there is dynamic voltage and/or temperature variation (such as time-varying noise or power-supply variation). For example, the average target reference from historical or prior target references may be used in a continuous adaptation process. Alternatively, the historical or prior target references may be used to probabilistically determine a current target reference. In some embodiments, the historical or prior target references and one or more environmental characteristics (such as temperature, supply voltage, noise, etc.) may be stored in a look-up table or used to determine a function that uses current values of the one or more environmental characteristics as an input and that provides a current target reference.

In the present discussion, a SAR analog-to-digital conversion may be applied to a wide variety of input signals. For example, an input signal may include a frame. This frame may include an image, where the different SAR ADCs receive analog inputs corresponding to different spatial locations or regions. Alternatively, in some embodiments, such as in a scanning system, a frame may be progressively captured over a time interval (such as several milliseconds). Thus, in these embodiments, the SAR ADCs may receive analog inputs corresponding to different spatial locations or regions that are captured at different times.

Figure 7:
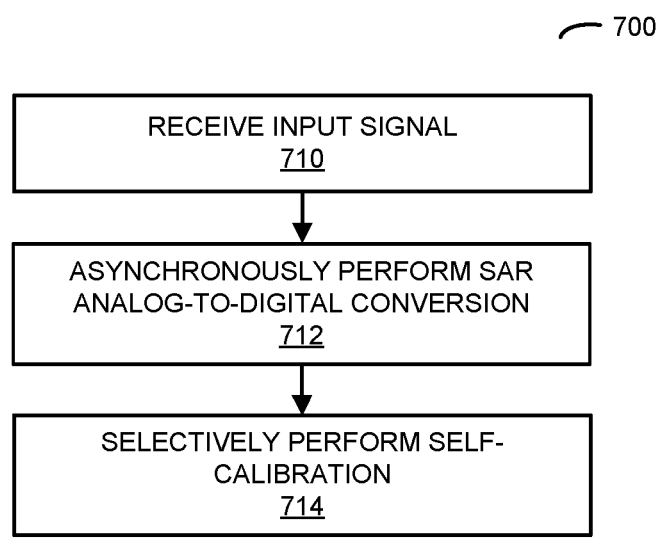
FIG. 7 is a flow diagram illustrating an example of a method for performing analog-to-digital conversion according to some embodiments of the present disclosure.

We now describe embodiments of a method. FIG. 7 presents a flow diagram illustrating an example of a method 700 for performing analog-to-digital conversion using an ADC, such as SAR ADC 200 (FIG. 2) or SAR ADC 600 (FIG. 6). During operation, the ADC may receive an input signal (operation 710). Then, the ADC may asynchronously perform SAR analog-to-digital conversion (operation 712) of the input signal using bit-conversion circuits in the ADC, where the bit-conversion circuits provide a quantized representation of the input signal. Moreover, the ADC may selectively perform self-calibration (operation 714) of a global delay of the bit-conversions circuits.

In some embodiments of the method 700, there may be additional or fewer operations. Moreover, the order of the operations may be changed, and/or two or more operations may be combined into a single operation.

The disclosed ADCs and the circuit techniques can be (or can be included in) any electronic device. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the ADCs, in alternative embodiments, different components and/or subsystems may be present in the ADCs. Thus, the embodiments of the ADCs may include fewer components, additional components, different components, two or more components may be combined into a single component, a single component may be separated into two or more components, one or more positions of one or more components may be changed, and/or there may be different types of components.

Moreover, the circuits and components in the embodiments of the ADCs may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

An integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An analog-to-digital converter (ADC), comprising a conversion circuit configured to asynchronously performs successive-approximation-register (SAR) analog-to-digital conversion of an input signal using bit-conversion circuits, wherein the bit-conversion circuits are configured to provide a quantized representation of the input signal, and wherein the ADC is configured to selectively perform self-calibration of a global delay of the bit-conversion circuits.

2. The ADC of claim 1, wherein the timing self-calibration is iterative and subject to a constraint that a maximum conversion time is less than a target conversion time.

3. The ADC of claim 2, wherein the target conversion time corresponds to a conversion period specified by a sampling clock.

4. The ADC of claim 3, wherein the target conversion time has headroom relative to the conversion period.

5. The ADC of claim 1, wherein the ADC comprises a track and hold circuit configured to sample the input signal based at least in part on a sampling clock.

6. The ADC of claim 1, wherein the bit-conversion circuits are configured to asynchronously and sequentially perform the SAR analog-to-digital conversion to determine different bits in the quantized representation of the input signal.

7. The ADC of claim 6, wherein the bit-conversion circuits are configured to perform the SAR analog-to-digital conversion based at least in part on a target reference that specifies the global delay of the bit-conversion circuits and a target conversion time.

8. The ADC of claim 7, where the ADC comprises a feedback circuit configured to compare the quantized representation and the input signal and configured to provide a feedback signal.

9. The ADC of claim 8, where the ADC comprises control logic configured to adjust the global delay of the target reference based at least in part on the feedback signal until a conversion time, when the bit-conversion circuits complete determination of the quantized representation, approximately equals the target conversion time.

10. The ADC of claim 9, where approximately equals means that the conversion time is less than or equal to the target conversion time and a difference between the target conversion time and the conversion time is minimized.

11. The ADC of claim 9, where the control logic is configured to adjust the global delay based at least in part on historical or prior target references that were determined during prior SAR analog-to-digital conversions.

12. The ADC of claim 11, where the control logic is configured to determine the target reference based at least in part on an average of the historical or prior target references.

13. The ADC of claim 11, where the control logic is configured to determine the target reference using systematic underrelaxation of the historical or prior target references.

14. The ADC of claim 9, where the control logic is configured to adjust the global delay based at least in part on a search technique.

15. The ADC of claim 14, where the search technique comprises: a linear search, or a binary search.

16. The ADC of claim 9, where the control logic is configured to adjust the global delay based at least in part on a function corresponding to historical or prior target references or a look-up table that comprises the historical or prior target references.

17. The ADC of claim 9, where the control logic is configured to selectively adjust the global delay based at least in part on a change in an environmental characteristic.

18. The ADC of claim 17, where the environmental characteristic comprises noise, temperature or a power-supply voltage of the ADC.

19. A system comprising:
an analog-to-digital converter (ADC), comprising a conversion circuit configured to asynchronously performs successive-approximation-register (SAR) analog-to-digital conversion of an input signal using bit-conversion circuits, wherein the bit-conversion circuits are configured to provide a quantized representation of the input signal, and
wherein the ADC is configured to selectively perform self-calibration of a global delay of the bit-conversion circuits.

20. A method for performing analog-to-digital conversion, comprising:
by an analog-to-digital converter (ADC):
receiving an input signal;
asynchronously performing successive-approximation-register (SAR) analog-to-digital conversion of the input signal using bit-conversion circuits in the ADC, wherein the bit-conversion circuits provide a quantized representation of the input signal; and
selectively performing self-calibration of a global delay of the bit-conversion circuits.

* * * * *